United States Patent [19]
Géndre et al.

[11] Patent Number: 5,798,034
[45] Date of Patent: Aug. 25, 1998

[54] PROCESS FOR THE PREPARATION OF A SUPERCONDUCTOR MATERIAL OF THE MIXED OXIDE TYPE

[75] Inventors: Philippe Géndre, Nanterre; Pierre Regnier, Bures sur Yvette; Lélia Schmirgeld-Mignot, Palaiseau; André Marquet, Paris, all of France

[73] Assignee: Commissariat a l'Energie Atomique, Paris, France

[21] Appl. No.: 700,476

[22] PCT Filed: Mar. 8, 1995

[86] PCT No.: PCT/FR95/00262

§ 371 Date: Mar. 3, 1997

§ 102(e) Date: Mar. 3, 1997

[87] PCT Pub. No.: WO95/24739

PCT Pub. Date: Sep. 15, 1995

[30] Foreign Application Priority Data

Mar. 9, 1994 [FR] France ............................ 94 02710

[51] Int. Cl.$^6$ .................. C25D 5/10; C25D 5/50; C23C 39/24; B23K 39/24
[52] U.S. Cl. ............. 205/170; 205/182; 205/224; 505/434; 505/472
[58] Field of Search ................ 205/170, 182, 205/224; 505/434, 472

[56] References Cited

U.S. PATENT DOCUMENTS

| | | | |
|---|---|---|---|
| 4,939,308 | 7/1990 | Maxfield et al. | 505/434 |
| 5,120,707 | 6/1992 | Maxfield et al. | 205/1 |
| 5,162,295 | 11/1992 | Behi et al. | 505/1 |

FOREIGN PATENT DOCUMENTS

WO 89/10336  11/1989  WIPO.

*Primary Examiner*—Kathryn L. Gorgos
*Assistant Examiner*—Edna Wong
*Attorney, Agent, or Firm*—Burns, Doane, Swecker & Mathis, L.L.P.

[57] ABSTRACT

The invention relates to a process for the preparation of a superconductor material of the mixed oxide type, such as oxides of the YBaCuO and $Bi_2Sr_2CaCu_2O_8$ type. This process consists of the deposition by electrolysis on a conductive substrate of successive layers of metallic elements entering in the constitution of the superconductor material, using a single element in each layer and carrying out, following the deposition of at least one of the layers, an intermediate oxidation-reaction heat treatment for fixing the element of said layer before depositing the following layer, optionally repeating one or more times at least part of the aforementioned operations, and subjecting all the layers to a final, oxidation heat treatment to form the mixed superconductor oxide. In this process, as a result of the order of the deposition of the layers and the performance of one or more intermediate, oxidation-reaction, heat treatments, it is possible to obtain a narrow superconductor transition and high critical current densities.

27 Claims, 3 Drawing Sheets

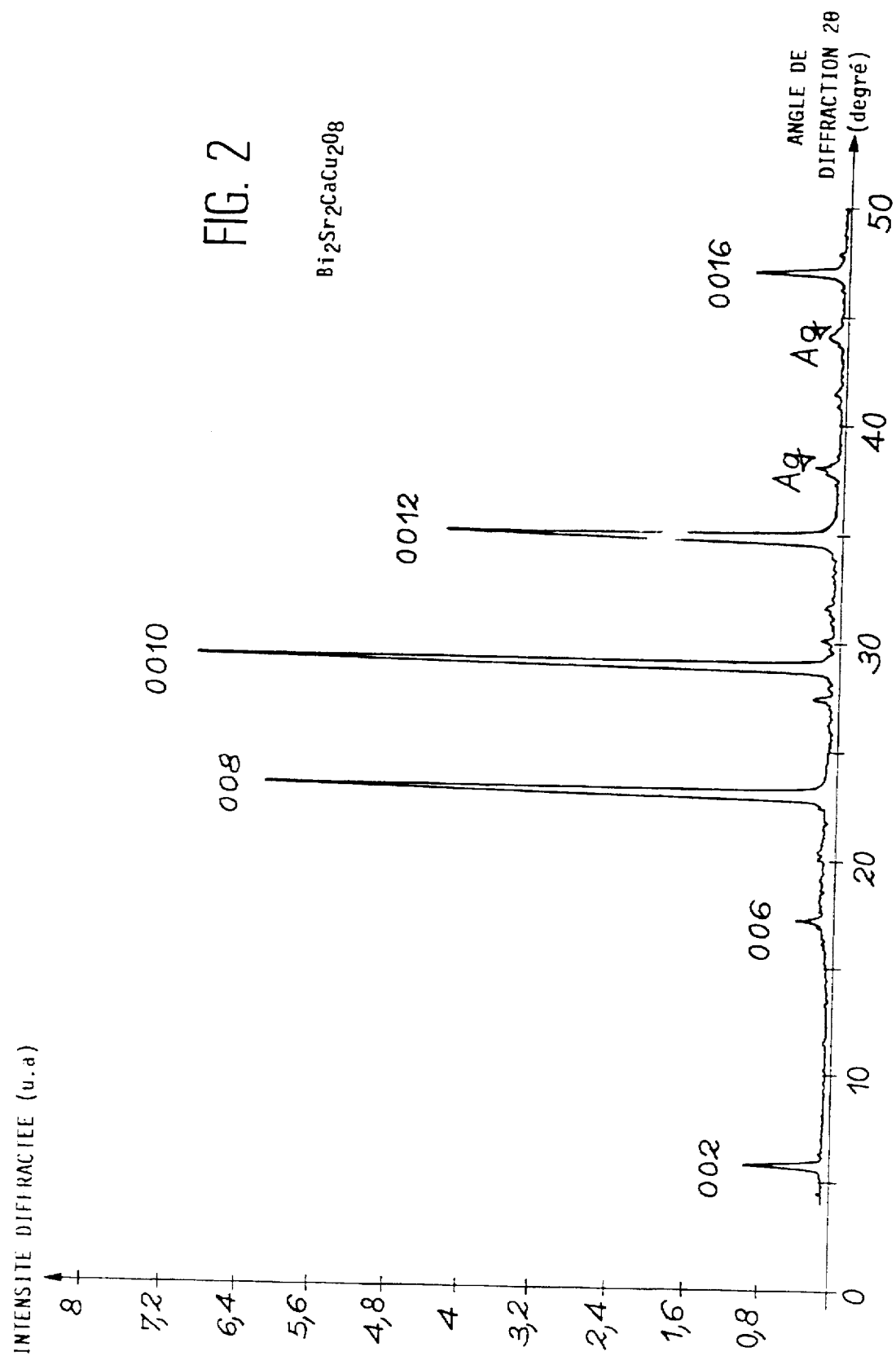

PROCESS FOR THE PREPARATION OF A SUPERCONDUCTOR MATERIAL OF THE MIXED OXIDE TYPE

This is a national stage application of PCT/FR95/00262 filed Mar. 8, 1995.

BACKGROUND OF THE INVENTION

1. Field of the Invention

The invention relates to a process for the preparation of a superconductor material of the mixed oxide type at a high critical temperature.

2. Description of the Related Art

Superconductivity is a phenomenon developing at temperatures below the critical temperature of a material, i.e. the temperature as from which the electrical resistance of said material becomes equal to 0 and a perfect diamagnetism is observed. This phenomenon is very interesting, because it permits power transmission at temperatures below the critical temperature without any energy loss.

The first superconductor materials discovered had very low critical temperatures requiring a cooling by means of liquid helium. In 1986, Bednorz and Müller discovered a new superconductor of the oxide type having a critical temperature above 30K and no longer requiring a cooling by liquid helium. Other mixed superconductor oxides were then found, such as e.g. the oxide $YBa_2Cu^3O_{7-x}$, whose critical temperature is approximately 90K, so that there is no need for liquid helium for cooling it.

However, for most superconductor applications, it is necessary to prepare said materials in the form of either layers deposited on substrates in order to obtain thin films intended for microelectronics with a surface area of a few square centimeters and a thickness below 1 micrometer, or wires, ribbons or other conductors for high power electrical engineering and whose length will be several hundred or even several thousand meters and having a thickness of a few micrometers to a few millimeters.

For the preparation of thin films, it is possible to use conventional film vapour deposition methods such as laser ablation, cathode, radiofrequency and other sputtering processes, vapour deposition of organometallic compounds, etc. With these methods, products are obtained having an excellent electrical and magnetic quality, but the use of these methods for producing ribbons or products of great length is difficult to envisage due to the constraints involved in obtaining said quality. Thus, the excellence of the performance characteristics is only achieved on monocrystalline substrates, which are difficult to produce in great lengths. Moreover, in all these methods, the deposition rate is generally too slow to be able to produce at an acceptable cost layers with a thickness of a few micrometers over hundreds of meters. Finally, research has shown that for thicknesses exceeding 1 micrometer, the layers prepared lose their texture and consequently transmit lower current densities.

Moreover, for the preparation of very long products, consideration has been given to the use of powder metallurgy processes starting from the superconductor oxide in powder form or pulverulent precursor oxides which can be transformed into a superconductor by a heat treatment, filling a metal tube with these powders and then bringing it into the form of wires or ribbons by mechanical operations such as spinning, accompanied or not by intermediate annealing operations. The composites obtained are finally annealed in order to join together the superconductor grains and increase the power transmission capacity of the product obtained. However, this process suffers from the following disadvantages:

1. requires a large number of operations,
2. requires an optimization in order that the section of the superconductor oxide remains constant over the entire wire length, because a single necking is sufficient to reduce to zero the overall superconductivity and
3. retain in the metal sheath gases prejudicial to the quality of the product.

A process for the preparation of long products is known, which makes use of the deposition of metal coatings by electrolytic processes, such as is described in U.S. Pat. No. 5,162,295.

According to this document, deposition takes place on a conductive substrate of layers of metals entering into the composition of the mixed superconductor oxide, the layers deposited then undergoing an oxidation treatment under conditions such that the mixed superconductor oxide is formed. However, this procedure suffers from the disadvantage of leading to superconductor films with a much too wide resistive transition and an extremely low critical current density.

SUMMARY OF THE INVENTION

The present invention relates to a process for the preparation of a superconductor material of the mixed oxide type which, although using said electrolytic deposition method, leads to superconductor materials having a narrow resistive transition and a high critical current density.

According to the invention, the process for the preparation of a superconductor material of the mixed oxide type having metallic elements comprises the following stages:

a) depositing by electrolysis on a conductive substrate successive layers of p metallic elements, each layer containing a single element and having a thickness such that it is not detached from the substrate or the previously deposited layer, and the order of the layers is such that the elements liable to react with the substrate are separated therefrom by at least one layer of another element, and performing, following the deposition of at least one of the layers, an intermediate, oxidation-reaction, heat treatment for fixing the element of said layer before depositing the following layer, b) optionally repeating one or more times at least certain of the electrolytic deposition and intermediate heat treatment operations of stage a) to obtain the desired superconductor material thickness and c) then subjecting all the layers to a final, oxidation, heat treatment at an adequate temperature for forming the mixed superconductor oxide.

In this process, the performance of at least one intermediate, oxidation-reaction, heat treatment, as well as the order in which the metal layers are deposited, make it possible to avoid that, during the final heat treatment, parasitic reactions do not occur with the substrate. Thus, during the final oxidation of the metal layers, various liquids with a low melting point can appear and react with the substrate and this is avoided in the present invention due to the intermediate heat treatment or treatments performed on the elements liable to give rise to the formation of such liquids. Moreover, the order of the deposits makes it possible to move away from the substrate the most reactive elements with respect thereto, particularly at the temperature of the final heat treatment. Moreover, by limiting the thickness of the layers, no exfoliation phenomena occur which are prejudicial to the quality of the product. This phenomenon is generally observed with layers of alkaline earth metals beyond a thickness of 2 micrometers, when they have a tendency to separate from the substrate. The thickness of the alkaline earth metal layers is generally limited to less than 2 μm.

Preferably, the process also comprises a prior treatment stage for the substrate with a view to facilitating the attachment of the first layer deposited thereon and/or improve the homogeneity of said first layer.

This treatment can consist of one or more cleaning, scouring, pickling and annealing operations using conventional methods improving the homogeneity and/or adhesion of the first deposit. This treatment is chosen as a function of the nature of the substrate used. Thus, for metal substrates, a simple and effective treatment consists of scouring followed by high temperature annealing, e.g. for 2 to 30 min, under air at a temperature of 700° to 800° C. in the case of silver.

The substrates which can be used can be constituted by various electricity conducting or non-conducting materials. In the case where they are made from non-conducting material, on the same is deposited a conductive layer, e.g. a silver layer using various processes, such as e.g. cathode sputtering, vapour deposition, dip coating, etc. In addition, the substrate material is chosen in such a way that, under the deposition and heat treatment conditions used, it does not give rise to parasitic reactions, even of a partial nature, with the elements of the layers deposited for forming the superconductor material. Examples of materials usable as the substrate are refractory, stainless steels.

The use as the substrate of oxidizable materials such as nickel or certain nickel alloys, which may or may not be coated with silver, can be of interest when it is wished to electrically insulate the superconductor layer.

Thus, with such materials, during the final heat treatment, the substrate oxidizes over a varying thickness, which insulates it electrically from the superconductor layer, which is beneficial for applications where a relatively high resistivity in the normal state is sought.

The order in which are deposited the layers of the different elements is chosen with a view to minimizing the interactions with the substrate, but also in order to avoid incompatibilities between the successive electrolysis baths and obtain after the first intermediate, oxidation-reaction treatment a sufficiently conductive layer to permit the following deposits. Thus, the intermediate, oxidation-reaction, heat treatment is performed on layers of metallic elements liable to form on the substrate with the elements of the previously deposited layers oxides which are sufficiently conductive to permit the deposition of the following layer.

In the production of each layer, the deposited quantities are not of an arbitrary nature, but instead a function of the final desired thickness and composition.

The thickness of each layer is chosen as a function of the critical thickness of the layer which is most easily exfoliated. When said thickness is chosen, a calculation takes place of the thicknesses of the following layers in such a way that they correspond to stoichiometric proportions with respect to the quantity of atoms of the layer which is exfoliated most easily. If necessary, the deposition of the layers takes place by the number of occasions necessary for obtaining the desired superconductor material thickness. Normally the total thickness of the deposited layers is 2 to 20 μm and the thickness of each layer 0.5 to 2 μm.

It is also possible to forecast that certain elements will be deposited in the form of several layers, whereas other elements will only be deposited in the form of a single layer. In this case, the thickness of the single layer must correspond to stoichiometry with respect to the total quantity of the element deposited in the form of several layers.

Thus, the process according to the invention can be very flexibly performed, because it is not necessary for the layer thickness of each metallic element to correspond to stoichiometry with respect to the other layers.

According to the invention, an intermediate, oxidation-reaction, heat treatment is performed on the layers of elements least stable from the mechanical and/or chemical standpoint or the least electricity conducting.

Thus, when the mixed oxide incorporates one or more alkaline earth metals, generally an intermediate, oxidation-reaction, heat treatment is performed after the deposition of each alkaline earth metal layer in order to fix the latter whilst obtaining a sufficiently conductive oxide mixture to permit the performance of other deposits. Therefore the process is of great interest, because by stabilizing in this way certain elements before the final treatment, it is possible to obviate parasitic reactions and the performance characteristics of the superconductor material are improved.

Moreover, this process can be performed for the preparation of very long elements such as wires or ribbons, by carrying out in a continuous manner the deposition and heat treatment operations.

Moreover, with this process, the final machining operations of the product obtained with a view to bringing it into its definitive form can be performed before or after the final heat treatment.

This process can also be performed for producing superconductor elements incorporating braided or twisted fibres using several products obtained by this process in order to form braids, including them in an appropriate sheath and then transforming the assembly by thermomechanical operations such as hammering and rolling-drawing, into superconductor elements having bundles of superconductor fibres.

This process can also be used for producing superconductor deposits directly on substrates having a complex shape, such as braids, twists, felts or foams.

The process according to the invention can also be performed in such a way as to form on the substrate superconductor circuits having a desired profile, either by directly depositing the metals in accordance with the desired line, or by subsequently machining the substrate covered with the deposited layers using mechanical, ionic, photochemical or lithographic processes in order to eliminate the layers from certain areas of the substrates, prior to or following the final heat treatment stage c).

With this process it is also possible to deposit at the end of the operation one or more substance layers for the protection, insulation, reinforcement, improvement of electrical and magnetic properties or thermalization of the superconductor materials. It is also possible to deposit a final metal layer serving as a substrate in order to recommence the sequence of operations leading to the superconductor material with a view to producing multistrand superconductors.

Another interesting possibility consists of firstly depositing a silver layer in which are dispersed atoms of another more oxidizable metal, so as to form during the final heat treatment a composite sheath reinforced by a fine dispersion of very hard oxide.

The process of the invention is easy to implement, because it essentially comprises deposition stages by electrolysis and heat treatments.

The electrolytic deposits can be produced by conventional methods using as the electrolytic deposition bath a solution of a salt of the element to be deposited and in particular a chloride or a nitrate, in an appropriate solvent such as water, dimethyl sulphoxide, acetonitrile or mixtures of the two latter substances. Generally, for the deposition operation, the substrate serves as the cathode and is associated with two counterelectrodes, which can be soluble anodes of the same nature as the deposited metal or insoluble anodes of platinum or platinum alloy in exemplified manner.

The intermediate heat treatments and the final heat treatment can be performed in air. The temperatures and durations of these treatments are chosen as a function of the elements and the superconductor material to be formed. The final treatment is generally performed in two stages with optionally an intermediate quenching or cooling stage.

The process of the invention is applicable to numerous mixed superconductor oxides. As examples of such oxides reference can be made to Y—Ba—Cu—O, La—Ba—Cu—O and La—Sr—Cu—O, or other mixed oxides derived therefrom by the partial or total substitution of yttrium by an element from the group of rare earths, and barium by strontium, whereas the copper can only be replaced in a very small proportion by other atoms.

Other examples of mixed superconductor oxides are Bi—Sr—Ca—Cu—O and Tl—Ba—Ca—Cu—O, Hg—Ba—Ca—Cu—O, Ag—Ba—Ca—Cu—O and their substituted derivatives (at present about 100 high temperature superconductors are known).

Other features and advantages of the invention will become more apparent from reading the following description given in an illustrative and non-limitative nature with reference to the attached drawings, wherein show:

BRIEF DESCRIPTION OF THE DRAWINGS

FIG. 2 An X-ray diffraction diagram of one of the two layers of FIG. 1.

DESCRIPTION OF THE PREFERRED EMBODIMENTS

Example 1

Figure 1:
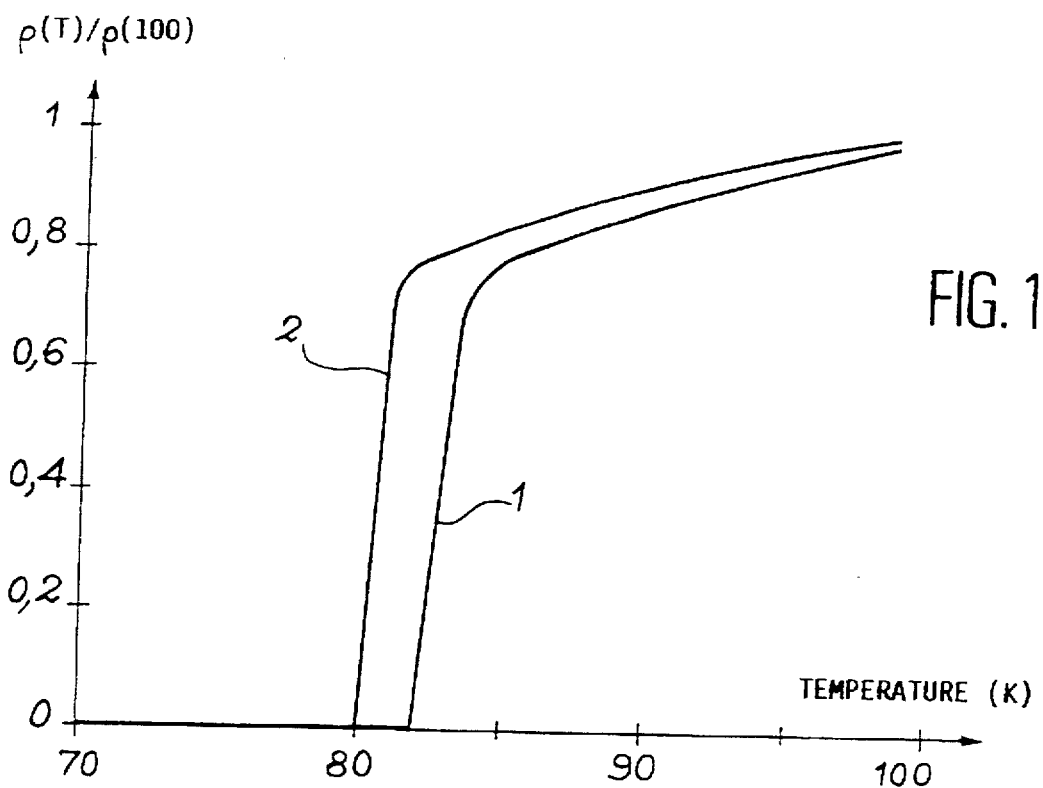
FIG. 1 Variations of the resistivity of two layers of $Bi_2Sr_2CaCu_2O_8$, obtained according to the invention, as a function of the temperature in K.

First Method of Preparing a $Bi_2Sr_2CaCu_2O_8$ Ribbon

The starting item is a substrate constituted by a rolled silver ribbon with a thickness of 50 μm, a width of 20 mm and a length of 35 mm. The substrate firstly undergoes scouring with trichloroethane and is then annealed in air at 850° C. for 15 min. Following this prior substrate treatment stage, the deposition of bismuth, strontium, calcium and copper layers takes place, working in the following way.

Having observed by X-ray diffraction and thermogravimetric analysis that bismuth melted before completely oxidizing during a temperature rise in air and finding that liquid bismuth reacted strongly with the silver substrate, it was concluded that this metal must not be deposited directly on the substrate, but instead as far away as possible therefrom. It was also observed that strontium and calcium did not form stable layers and it was therefore necessary on the one hand not to exceed a thickness of 1.5 to 2 μm corresponding to $3 \cdot 10^8$ atoms/cm² in order to have an adhesive deposit and on the other hand subject them to an intermediate, oxidation-reaction, heat treatment in order to fix these elements. Therefore the following stages were successively performed:

1) deposition of a copper layer,
2) deposition of a strontium layer,
3) intermediate, oxidation-reaction, heat treatment of the strontium and copper layers,
4) deposition of a bismuth layer,
5) deposition of a calcium layer,
6) intermediate, oxidation-reaction, heat treatment of the calcium layer,
7) repetition of stages 2, 3, 4, 5 and 6 and
8) final heat treatment.

In stage 1), the thickness of the copper layer corresponds to the total copper quantity required, i.e. nϵ copper atoms.

Conversely, in stages 2) and 4), the thickness of the layer only corresponds to ϵ atoms and in stage 3), the thickness of the layer corresponds to ϵ/2 calcium atoms. It is therefore necessary to repeat (n−1) times the stages 2), 3), 4) and 5) and (n−2) times stage 6).

A description will now be given of these different stages in the case where $\epsilon = 2.5 \cdot 10^{18}$ atoms/cm².

1) Deposition of the copper layer

Uniform deposition takes place of approximately $5 \cdot 10^{18}$ atoms of copper per cm² on each face of the silver ribbon using as the electrolysis bath the mixture $H_2O + H_2SO_4$ (0.5M)+$CuSO_4$, $5H_2O$(0.25M to 0.5M), placing the silver substrate between two copper counterelectrodes and passing through a total current of 180 mA. Following the deposition operation, elimination takes place of the final solution traces and the coated ribbon is then dried in air.

2) Deposition of the strontium layer

Uniform deposition takes place on the preceding layer of $2.5 \cdot 10^{18}$ strontium atoms per cm² using as the electrolysis bath a 0.1 mole/l strontium chloride solution in a mixture of dimethyl sulphoxide (DMSO) and acetonitrile (AN) (⅙ vol.), placing the copper-coated silver ribbon between two platinum counterelectrodes and passing through a total current of 180 mA. After deposition, the final solution traces are eliminated.

3) Intermediate heat treatment

This treatment consists of annealing the ribbon coated with the copper and strontium layers in air at 850° C. and for 5 min, which makes it possible to stabilize the strontium deposit.

4) Deposition of a bismuth layer

Uniform deposition takes place of approximately $2.5 \cdot 10^{18}$ bismuth atoms per cm² on the ribbon subjected to the preceding heat treatment, using an electrolysis bath constituted by a 1 mole/l bismuth nitrate solution in DMSO, placing the ribbon between two platinum counterelectrodes and passing through a total current of 180 mA. After deposition, the final traces of solution are eliminated.

5) Deposition of the calcium layer

Uniform deposition takes place of approximately $1.25 \cdot 10^{18}$ calcium atoms/cm² on the preceding deposit, using an electrolysis bath constituted by a 1 mole/l calcium chloride solution in DMSO, placing the coated ribbon between two platinum counterelectrodes and passing through a total current of 180 mA. Following deposition, the final traces of solution are eliminated.

6) Intermediate heat treatment

In order to perform this treatment, the ribbon coated in the preceding stages undergoes annealing in air at 850° C. and for 2 minutes.

7) Repetition of stages 2 to 5
8) Final heat treatment

To carry out this heat treatment in air, the product constituted by the silver substrate coated with the different layers is introduced into a furnace heated to 800° C. and the temperature is rapidly increased at a rate of 1000° C./h to 850° to 860° C., which is maintained for 2 minutes, followed by quenching cooling at a rate of approximately 1000° C./min to about 20° C., followed by reheating at a rate of 60° C./h to a temperature of 800° C., maintaining the latter for 60 hours and finally carrying out rapid quenching in air to ambient temperature.

The resistivity of the thus obtained superconductor material is then determined as a function of the temperature in K.

The results obtained are given in FIG. 1, where Curve 1 represents the variations of the resistivity $\rho$ expressed in $\rho(T)/\rho(100K)$, as a function of the temperature in K under a current density of 500 A/cm$^2$.

In Curve 1, it can be seen that the superconductor transition is narrow and is at approximately 82K. Moreover, a measurement of the density of the critical current at 77K indicates that it is 10,000 to 15,000 A/cm$^2$.

The layer is also studied by X-ray diffraction and the diagram corresponding to Curve 2 of FIG. 1 is shown in FIG. 2. It can be seen that the various grains of the layers have virtually all their planes (a, b) parallel to the plane of the ribbon, which explains the very high critical current densities measured.

Example 2

Second Method for Preparing a Bi$_2$Sr$_2$CaCu$_2$O$_8$ Ribbon

The operating procedure of Example 1 is adopted for preparing a silver ribbon coated with said superconductor material, but the final heat treatment is performed using a temperature of 840° C. for 12 hours for the final range in place of 800° C. for 60 hours.

Curve 2 of FIG. 1 represents the resistivity of the material obtained as a function of the temperature under a current density of 500 A/cm$^2$. In this case, the superconductor transition is observed as a slightly lower temperature of 80K. The critical current density at 77K is also 10,000 to 15,000 A/cm$^2$.

It should be noted that similar results are obtained on thicker layers prepared according to Example 1, repeating a first time the deposition and intermediate heat treatment stages 2 to 6 and a second time stages 2 to 5 using a larger copper deposit in the first stage.

Example 3

Preparation of the superconductor material YBa$_2$Cu$_3$O$_7$

In order to produce this material, the starting product is constituted by a rolled silver plate with a thickness of 50 μm, a width of 20 mm and a length of 35 mm, which, as in Example 1, undergoes a prior trichloroethane scouring treatment, followed by annealing in air at 850° C. and for 15 minutes. This is followed by the following stages:

1) deposition of a copper layer having approximately 7.5·10$^{18}$ copper atoms per cm$^2$, working as in Example 1, 2) deposition of an yttrium layer having approximately 1.25·10$^{18}$ yttrium atoms per cm$^2$ and using as the electrolysis bath a 0.1 mole/l yttrium nitrate solution in DMSO and placing the silver plate between two platinum counterelectrodes with a total current of 180 mA, followed by the elimination of the residual electrolyte, 3) annealing under air at 850° C. and for 2 minutes, 4) deposition of a barium layer having 2.5·10$^{18}$ barium atoms per cm$^2$ based on a 0.1 mole/l barium chloride solution in a mixture of DMSO and AN (⅙ vol.), using a total current of 180 mA and two platinum counterelectrodes, followed by an elimination of the final traces of solution, 5) annealing in air at 850° C. for 2 minutes, 6) repetition of stages 2 to 4, and 7) final heat treatment under purified oxygen involving successively a rapid temperature rise of 300° C./h to 920° C., a period of 15 h at this temperature, cooling at a rate of 1° C./min to 450° C., a period of 2 h at the latter temperature and finally cooling at 1° C./h to ambient temperature.

Figure 3:
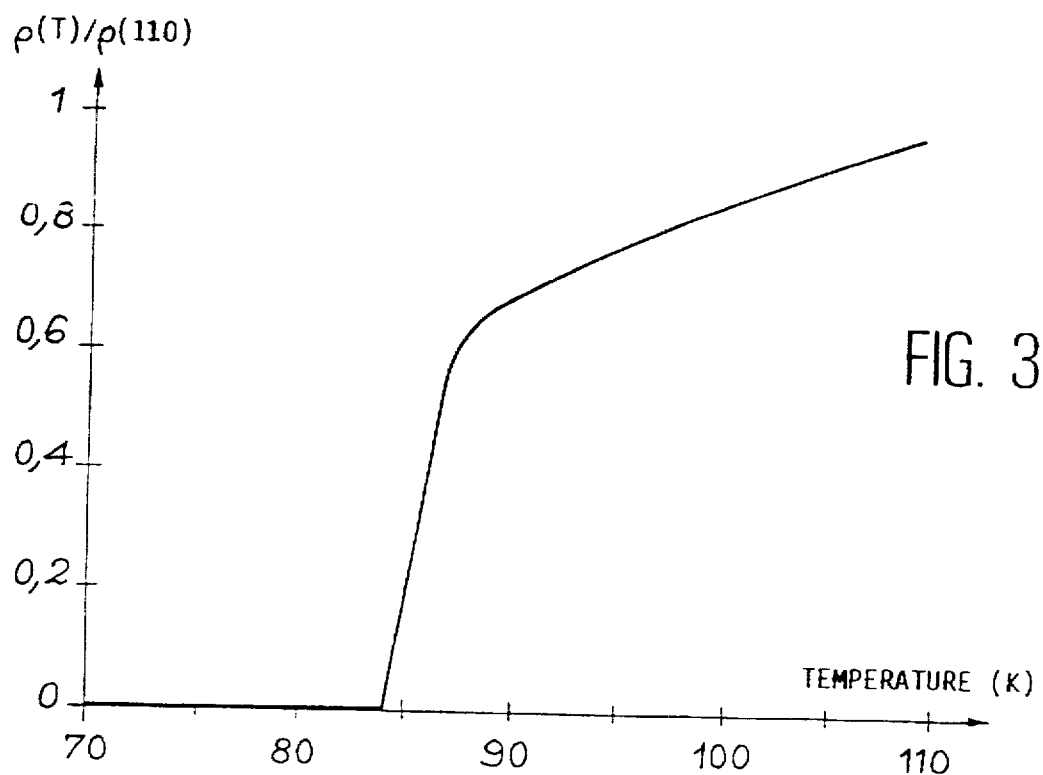
FIG. 3 Variations of the resistivity of a YBaCuO layer obtained according to the invention, as a function of the temperature in K.

Determination then takes place, as in Example 1, of the resistivity variations of the YBa$_2$Cu$_3$O$_7$ layer as a function of the temperature and under a current density of 500 A/cm$^2$. The results obtained are given in FIG. 3, which illustrates the resistivity variation $\rho(T)/\rho(110)$ as a function of the temperature in K. FIG. 3 shows that the superconductor transition is narrow and corresponds to a critical temperature under weak current of 86 to 90K. The critical current density at 77K is between 2,000 and 5,000 A/cm$^2$.

Figure 4:
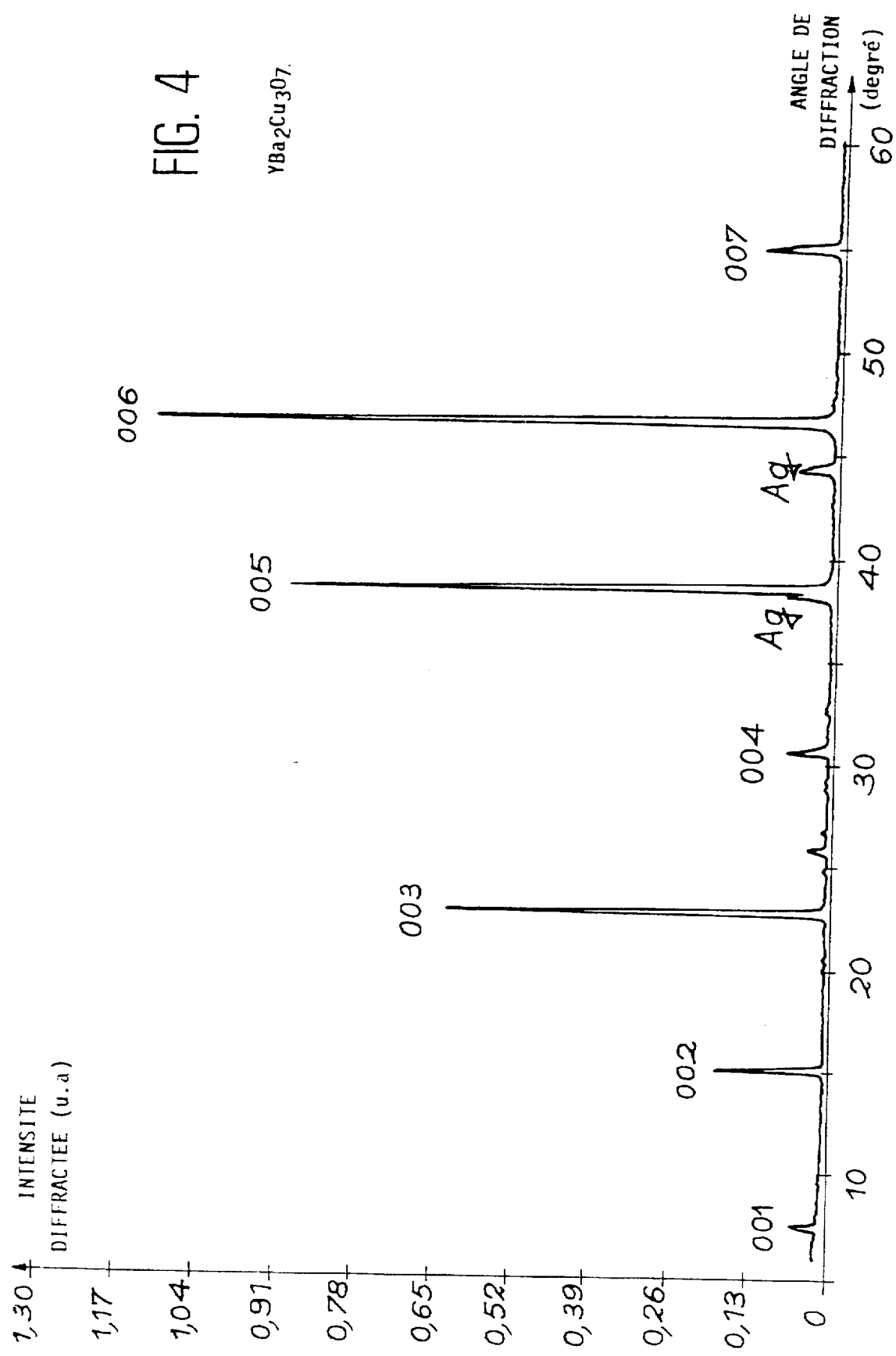
FIG. 4 An X-ray diffraction diagram of the layer of FIG. 3.

FIG. 4 shows the X-ray diffraction diagram of the layer obtained. It can be seen that the various grains of the layer have virtually all their planes (a, b) parallel to the ribbon.

Conversely, the microstructure of this layer differs significantly from that of Example 1. Thus, the Bi$_2$Sr$_2$CaCu$_2$O$_8$ layers are constituted by several thicknesses of extremely flat grains, whereas the YBa$_2$Cu$_3$O$_7$ layer has less of these. Moreover, in the Bi$_2$Sr$_2$CaCu$_2$O$_8$ layer, the stack of grains forms terraces with relatively sharp angles covering the entire surface of the substrate, whereas in YBaCuO, the grains are more rounded and are so strongly engraved at the joints that the silver of the substrate appears at the triple junctions.

However, the use of substrates with a higher melting point than that of silver would make it possible to perform the final heat treatment at a higher temperature in order to melt the YBa$_2$Cu$_3$O$_7$ and obtain by slow solidification much higher critical currents. In the same way, the use of a substrate having a linear expansion coefficient closer to that of YBa$_2$Cu$_3$O$_7$ than silver would eliminate the cracking and increase the critical current density.

On comparing the results obtained in these examples with those obtained in U.S. Pat. No. 5,162,295, it can be seen that the resistive transitions are narrower with the process according to the invention (17 to 90K in the case of the US patent and 86 to 90K in the invention) and that the critical current densities are much higher in the invention. The YBaCuO prepared according to the US patent is not superconductive at 77K, whereas that prepared according to the invention has, at the same temperature, a critical current density of approximately 5000 A/cm$^2$.

Thus, the process according to the invention is very interesting, because it significantly improves the performance characteristics of the superconductor material compared with the process of U.S. Pat. No. 5,162,295. Moreover, it can be performed for obtaining superconductor elements of various forms and in particular composite elements, electronic circuits, ribbons, wires, filaments, etc. The process can be performed so as to have several complimentary deposition stages of one or more layers intended for the protection, insulation, reinforcement or thermalization of the superconductor material.

We claim:

1. Process for the preparation of a superconductor material comprising the following steps:
   a) depositing by electrolysis on a conductive substrate successive layers of metallic elements, each layer containing a single element and having a thickness such that each layer is not detached from the substrate or a previously deposited layer, and wherein elements liable to react with the substrate are separated therefrom by at least one layer of another element, and performing, following the deposition of at least one layer, an intermediate, oxidation-reaction, heat treatment for fixing the element of said layer before depositing a subsequent layer,
   b) optionally repeating one or more times any portion of the depositing by electrolysis and intermediate heat treatment operations of step a) to obtain a pre-determined superconductor material thickness and
   c) then subjecting all the layers to a final, oxidation, heat treatment to form the superconductor material.

2. Process according to claim 1, wherein the process further comprises a prior substrate treatment step.

3. Process according to claim 2, wherein the prior treatment consists of scouring, followed by high temperature annealing.

4. Process according to claim 3, wherein the substrate comprises silver.

5. Process according to claim 3, wherein the substrate is an oxidizable metallic material which permits, during the oxidation treatment of step c), the formation of an oxide layer of said metallic material which electrically insulates the conductive substrate from the superconductor material.

6. Process according to claim 1, wherein the substrate comprises silver.

7. Process according to claim 6, wherein atoms of another metal, more oxidizable than silver are dispersed in the silver so that during the final heat treatment of step c) a composite sheath reinforced by a fine dispersion of very hard oxide is formed.

8. Process according to claim 1, wherein the substrate is an oxidizable metallic material which permits, during the oxidation treatment of step c), the formation of an oxide layer of said metallic material which electrically insulates the metallic substrate from the superconductor material.

9. Process according to claim 1, wherein the intermediate, oxidation-reaction, heat treatment is performed on layers of metallic elements liable to form on the substrate with elements of previously deposited layers oxides which layers have a conductivity that permits deposition of the subsequent layer.

10. Process according to claim 1, wherein the thickness of each layer is 0.5 to 2 μm.

11. Process according to claim 1, wherein the deposited layers have a total thickness of 2 to 20 μm.

12. Process according to claim 11, wherein at least one of the metallic elements is an alkaline earth metal and further wherein in step a) there is an intermediate, oxidation-reaction, heat treatment after depositing the alkaline earth metal layer.

13. Process according to claim 1, wherein at least one of the metallic elements is an alkaline earth metal and further wherein in step a) there is an intermediate, oxidation-reaction, heat treatment after depositing the alkaline earth metal layer.

14. Process according to claim 13, wherein the process further comprises machining the substrate and layers either before or after the final heat treatment step c) to shape the substrate and layers into a superconductor element.

15. Process according to claim 13, wherein in step a) the metallic elements are deposited in a pre-determined line to form on the substrate a superconductor material circuit.

16. Process according to claim 13, wherein the process further comprises a step of machining the layers deposited on the substrate in order to eliminate said layers over certain substrate areas and form on the substrate a superconductor material circuit before or after the final heat treatment step c).

17. Process according to claim 13, wherein the layers are deposited on the substrate in a complex form selected from the group consisting of braids, twists, felts and foams.

18. Process according to claim 13, wherein the superconductor material, optionally assembled in the form of braids or twists, is included in an appropriate sheath to form an assembly, the assembly then undergoing thermomechanical treatments.

19. Process according to claim 1, wherein the process further comprises machining the substrate and layers either before or after the final heat treatment step c) to shape the substrate and layers into a superconductor element.

20. Process according to claim 1, wherein in step a) the metallic elements are deposited in a pre-determined line to form on the substrate a superconductor material circuit.

21. Process according to claim 20, wherein the process further comprises at least one additional step of depositing a metal layer or a layer of a substance intended for protection, insulation, reinforcement, improvement of electrical and magnetic properties or thermalization of the superconductor material.

22. Process according to claim 1, wherein the process further comprises a step of machining the layers deposited on the substrate in order to eliminate said layers over certain substrate areas and form on the substrate a superconductor material circuit before or after the final heat treatment step c).

23. Process according to claim 1, wherein the layers are deposited on the substrate in a complex form selected from the group consisting of braids, twists, felts and foams.

24. Process according to claim 1, wherein the superconductor material, optionally assembled in the form of braids or twists, is included in an appropriate sheath to form an assembly, the assembly then undergoing thermomechanical treatments.

25. Process according to claim 1, wherein the process further comprises at least one additional step of depositing a metal layer, or a layer of a substance intended for protection, insulation, reinforcement, improvement of electrical and magnetic properties or thermalization of the superconductor material.

26. Process according to claim 25, wherein the superconductor material is a mixed oxide selected from the group consisting of YBaCuO, LaBaCuO, LaSrCuO, BiSrCaCuO, TlBaCaCuO, HgBaCaCuO, AgBaCaCuO and derivatives thereof.

27. Process according to claim 1, wherein the superconductor material is a mixed oxide selected from the group consisting of YBaCuO, LaBaCuO, LaSrCuO, BiSrCaCuO, TlBaCaCuO, HgBaCaCuO, AgBaCaCuO and derivatives thereof.

* * * * *